(12) United States Patent
Nakajima

(10) Patent No.: US 9,147,599 B2
(45) Date of Patent: Sep. 29, 2015

(54) WAFER SUPPORT SYSTEM AND METHOD FOR SEPARATING SUPPORT SUBSTRATE FROM SOLID-PHASE BONDED WAFER AND METHOD FOR MANUFACTURING SEMICONDUCTOR DEVICE

(71) Applicant: FUJI ELECTRIC CO., LTD., Kawasaki-shi (JP)

(72) Inventor: Tsunehiro Nakajima, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/249,480

(22) Filed: Apr. 10, 2014

(65) Prior Publication Data

US 2014/0220765 A1    Aug. 7, 2014

Related U.S. Application Data

(63) Continuation of application No. PCT/JP2012/076656, filed on Oct. 16, 2012.

(30) Foreign Application Priority Data

Oct. 18, 2011    (JP) .................................. 2011-228545

(51) Int. Cl.
*H01L 21/30* (2006.01)
*H01L 21/762* (2006.01)
(Continued)

(52) U.S. Cl.
CPC ........ *H01L 21/76254* (2013.01); *H01L 21/187* (2013.01); *H01L 21/78* (2013.01); *H01L 21/84* (2013.01); *H01L 29/66333* (2013.01); *H01L 21/6836* (2013.01)

(58) Field of Classification Search
CPC .............................. H01L 23/15; H01L 21/762
USPC ................... 372/25, 39; 219/121.85; 438/458
See application file for complete search history.

(56) References Cited

U.S. PATENT DOCUMENTS 6,372,608 B1 * 4/2002 Shimoda et al. .............. 438/455
6,387,829 B1 * 5/2002 Usenko et al. ................ 438/120
(Continued)

FOREIGN PATENT DOCUMENTS

JP    2003-531492 A    10/2003
JP    2005-129652 A    5/2005
(Continued)

OTHER PUBLICATIONS

International Search Report issued in PCT/JP2012/076656, Mailing date Nov. 27, 2012. Please note, references cited in ISR were previously cited in an IDS filed Apr. 10, 2014 English Translation provided.

*Primary Examiner* — Caleb Henry
(74) *Attorney, Agent, or Firm* — Rossi, Kimms & McDowell LLP

(57) ABSTRACT

A method is disclosed for separating a support substrate from a solid-phase bonded wafer which includes a Si wafer and support substrate solid-phase bonded to back surface of the Si wafer. The method includes a step of irradiating the Si wafer with laser light with a wavelength which passes through the Si wafer and is focused on a solid-phase bonding interface between the Si wafer and support substrate to form a breaking layer in at least part of an outer circumferential portion of the solid-phase bonding interface, a step of separating the breaking layer; and a step of separating the solid-phase bonding interface. The method is capable of using a Si thin wafer without substantial wafer cracking at an initial stage where the wafer is inputted to a wafer process, capable of separating a support substrate from the Si thin wafer easily, and capable of reducing the wafer cost.

14 Claims, 8 Drawing Sheets

(51) Int. Cl.
*H01L 21/18* (2006.01)
*H01L 21/78* (2006.01)
*H01L 29/66* (2006.01)
*H01L 21/84* (2006.01)
*H01L 21/683* (2006.01)

(56) References Cited

U.S. PATENT DOCUMENTS

| | | | |
|---|---|---|---|
| 6,784,071 B2 * | 8/2004 | Chen et al. | 438/401 |
| 6,809,044 B1 * | 10/2004 | Aspar et al. | 438/120 |
| 6,846,703 B2 * | 1/2005 | Shimoda et al. | 438/109 |
| 6,884,694 B2 * | 4/2005 | Park et al. | 438/455 |
| 6,921,914 B2 * | 7/2005 | Cheng et al. | 257/19 |
| 6,995,075 B1 * | 2/2006 | Usenko | 438/458 |
| 7,045,441 B2 * | 5/2006 | Chang et al. | 438/458 |
| 7,091,108 B2 * | 8/2006 | Tolchinsky et al. | 438/458 |
| 7,148,124 B1 * | 12/2006 | Usenko | 438/458 |
| 7,378,332 B2 * | 5/2008 | Tomita et al. | 438/459 |
| 7,391,047 B2 * | 6/2008 | Henley et al. | 257/18 |
| 7,482,249 B2 * | 1/2009 | Jakob et al. | 438/460 |
| 7,524,736 B2 * | 4/2009 | Ottaviani et al. | 438/455 |
| 7,531,429 B2 * | 5/2009 | Tolchinsky et al. | 438/458 |
| 7,749,870 B2 * | 7/2010 | Kawai et al. | 438/458 |
| 7,765,861 B2 * | 8/2010 | Jacquemin | 73/150 A |
| 7,968,194 B2 * | 6/2011 | Inada et al. | 428/413 |
| 7,968,195 B2 * | 6/2011 | Inada et al. | 428/413 |
| 8,003,491 B2 * | 8/2011 | Cherekdjian et al. | 438/458 |
| 8,058,148 B2 * | 11/2011 | Cherekdjian et al. | 438/458 |
| 8,424,746 B2 * | 4/2013 | Adachi et al. | 228/121 |
| 8,563,401 B2 * | 10/2013 | Akiyama et al. | 438/458 |
| 8,598,013 B2 * | 12/2013 | Yamazaki et al. | 438/458 |
| 8,617,930 B2 * | 12/2013 | Inada et al. | 438/113 |
| 2001/0026997 A1 * | 10/2001 | Henley et al. | 438/458 |
| 2002/0106870 A1 * | 8/2002 | Henley et al. | 438/464 |
| 2003/0162367 A1 | 8/2003 | Roche | |
| 2003/0232487 A1 * | 12/2003 | Letertre et al. | 438/459 |
| 2004/0137655 A1 * | 7/2004 | Chikuma et al. | 438/22 |
| 2004/0180518 A1 * | 9/2004 | Chang et al. | 438/487 |
| 2005/0130391 A1 * | 6/2005 | Takayama et al. | 438/458 |
| 2005/0175053 A1 * | 8/2005 | Kimura et al. | 372/50.12 |
| 2006/0097277 A1 * | 5/2006 | Yoo | 257/99 |
| 2006/0128065 A1 * | 6/2006 | Inada et al. | 438/118 |
| 2006/0163209 A1 * | 7/2006 | Boyle et al. | 216/94 |
| 2006/0189017 A1 * | 8/2006 | Nogami | 438/46 |
| 2007/0117354 A1 * | 5/2007 | Gadkaree et al. | 438/478 |
| 2007/0184632 A1 * | 8/2007 | Yamazaki et al. | 438/459 |
| 2007/0238312 A1 * | 10/2007 | Murakami et al. | 438/766 |
| 2007/0281172 A1 * | 12/2007 | Couillard et al. | 428/446 |
| 2007/0281399 A1 * | 12/2007 | Cites et al. | 438/149 |
| 2007/0281440 A1 * | 12/2007 | Cites et al. | 438/458 |
| 2007/0298587 A1 * | 12/2007 | Park et al. | 438/458 |
| 2008/0171187 A1 * | 7/2008 | Inada et al. | 428/220 |
| 2008/0267238 A1 * | 10/2008 | Takeuchi et al. | 372/46.012 |
| 2008/0286594 A1 * | 11/2008 | Inada et al. | 428/523 |
| 2008/0305583 A1 * | 12/2008 | Inada et al. | 438/118 |
| 2008/0310471 A1 * | 12/2008 | Bessho et al. | 372/44.01 |
| 2009/0026185 A1 | 1/2009 | Sakamoto | |
| 2009/0093103 A1 * | 4/2009 | Henley et al. | 438/458 |
| 2009/0111248 A1 * | 4/2009 | Ohnuma et al. | 438/480 |
| 2009/0137101 A1 * | 5/2009 | Yamazaki et al. | 438/479 |
| 2009/0186216 A1 * | 7/2009 | Inada et al. | 428/337 |
| 2009/0241656 A1 * | 10/2009 | Jacquemin | 73/150 A |
| 2009/0275196 A1 * | 11/2009 | Yamazaki et al. | 438/652 |
| 2010/0194014 A1 * | 8/2010 | Huang et al. | 269/287 |
| 2010/0261335 A1 * | 10/2010 | Andry et al. | 438/462 |
| 2010/0330788 A1 * | 12/2010 | Yu et al. | 438/514 |
| 2011/0073890 A1 * | 3/2011 | Sugizaki et al. | 257/98 |
| 2011/0114984 A1 * | 5/2011 | Seong | 257/98 |
| 2011/0127567 A1 * | 6/2011 | Seong | 257/99 |
| 2011/0171812 A1 * | 7/2011 | Letertre et al. | 438/458 |
| 2011/0188532 A1 * | 8/2011 | Hata et al. | 372/50.12 |
| 2011/0204412 A1 | 8/2011 | Sugano | |
| 2011/0256666 A1 * | 10/2011 | Sugo et al. | 438/113 |
| 2012/0012048 A1 * | 1/2012 | Letertre et al. | 117/95 |
| 2012/0058621 A1 * | 3/2012 | Letertre et al. | 438/458 |
| 2012/0241919 A1 * | 9/2012 | Mitani | 257/623 |
| 2013/0224932 A9 * | 8/2013 | Inada et al. | 438/464 |
| 2014/0057450 A1 * | 2/2014 | Bourbina et al. | 438/759 |
| 2014/0144593 A1 * | 5/2014 | Dang et al. | 156/712 |
| 2014/0147986 A1 * | 5/2014 | Dang et al. | 438/458 |

FOREIGN PATENT DOCUMENTS

| | | |
|---|---|---|
| JP | 2006-043713 A | 2/2006 |
| JP | 2009-266892 A | 11/2009 |
| JP | 2010-103424 A | 5/2010 |
| JP | 2012-079836 A | 4/2012 |
| JP | 2012-079871 A | 4/2012 |

\* cited by examiner

WAFER SUPPORT SYSTEM AND METHOD FOR SEPARATING SUPPORT SUBSTRATE FROM SOLID-PHASE BONDED WAFER AND METHOD FOR MANUFACTURING SEMICONDUCTOR DEVICE

BACKGROUND OF THE INVENTION

A. Field of the Invention

The present invention relates to a WSS (Wafer Support System) wafer (solid-phase bonded wafer), and particularly relates to a method for separating a support substrate from the WSS wafer and a method for manufacturing a semiconductor device using this method.

B. Description of the Related Art

As to a power device such as an IGBT (Insulated Gate Bipolar Transistor), it has been recognized that reduction in the thickness of a semiconductor substrate has a great advantage in view of characteristics such as reduction in energy loss, heat dissipation, etc. As for the reduction in the thickness of a semiconductor substrate, highest manufacturing efficiency can be obtained if a semiconductor device can be manufactured using a wafer (thin wafer) which is already thin in an initial stage where the wafer is inputted to a process. To this end, there is a strong need to establish a wafer process in which a thin wafer can be inputted without any problem. In fact, however, wafer cracking or the like increases easily due to stress caused by heat when a thin wafer is inputted in the initial stage of the process. Therefore, as shown in FIG. 3, for example, Si wafer 100a having a diameter of 8 inches and a thickness of 725 μm is generally prepared as a thick wafer, which is inputted in the initial stage of the process (FIG. 3(a)). A device structure such as an MOS (Metal Oxide Film Semiconductor) gate structure (not shown) and an emitter metal electrode (not shown) required for an IGBT is formed on one of surfaces of Si wafer 100a (FIG. 3(b)). After the device structure is formed on the front side, for example, the back side of Si wafer 100a is polished by a grinding machine and a CMP (Chemical Mechanical Polishing apparatus) in a step of thinning Si wafer 100a, which is a step close to the end of the second half of the process, to thereby make Si wafer 100a into Si wafer 100b with a thickness of 100 μm (FIG. 3(c)). Collector layer 101 and collector electrode 102 are formed on the back side of Si wafer 100b (FIG. 3(d)), which is then divided into IGBT chips 103 (FIG. 3(e)) by blade dicing. Practically such a manufacturing method using a process for finishing the wafer into a substrate with an intended thin thickness in the second half of a wafer process is often performed in order to prevent wafer cracking. As a result, 80% or more of the thickness of the inputted Si wafer is removed at the stage of a step of grinding the back surface thereof. Components derived from a grinding stone or impurity elements caused by doping are mixed in silicon dust generated by the grinding. Therefore, the silicon dust cannot be recycled.

In addition, a reinforcing rib system and a WSS system have been known as techniques for keeping the strength of a Si wafer and thinning the wafer simultaneously. The reinforcing rib system is a manufacturing method in which the inner circumferential side of the back surface of a wafer is ground and hollowed out during the aforementioned back-surface grinding while an outermost circumferential edge portion of the back surface of the wafer is left like a ring with a width of about 3 mm so that the wafer whose rigidity is kept in spite of its thin thickness can be inputted through manufacturing steps (FIG. 2). FIG. 2 shows the same steps as those in FIG. 3 except the back-surface grinding step shown in FIGS. 2(c) and 2(d).

On the other hand, the WSS system includes a temporary pasting system and a direct bonding system (solid-phase bonding system). According to the temporary pasting system for pasting a support substrate to the back surface of a wafer with an adhesive agent, high temperature processing cannot be performed after the adhesion. Therefore, in the temporary pasting system, a thick wafer is inputted at an initial stage. A support substrate is pasted to the front side of the wafer with an adhesive agent to keep the strength of the wafer in or after the second half of a wafer process where a high temperature processing step has been terminated. After that, the back surface of the wafer is ground to form a Si wafer. Necessary processing for a semiconductor device is applied to the back side of the Si wafer. After the processing, the support substrate is separated from the Si wafer.

The direct bonding system for bonding a support substrate to the back surface without an adhesive agent uses an existing Si wafer solid-phase bonding technique. When solid-phase bonding is used, high temperature processing such as an impurity thermal diffusion step in the first half of the wafer process can be performed without any problem even on the Si wafer to which the support substrate has been bonded. However, this technique is originally not based on the assumption that the support substrate will be separated again. Therefore, there is a problem in the fact that a method for easily separating the support substrate from the solid-phase bonded Si wafer has not been put into practice yet.

The strength of the Si wafer can be kept by the reinforcing rib system or the WSS system. Accordingly, reduction of a risk of wafer cracking during transportation, reduction of warp, etc. can be achieved. The WSS system or the WSS wafer that will be referred to in the following description means a system or a solid-phase bonded wafer in which a support substrate is directly bonded to the wafer by solid-phase bonding.

In addition, a technique called stealth dicing for dividing a wafer into chips has been known. The term "stealth" means hidden or invisible. According to this dividing technique, infrared laser light that can penetrate silicon is focused on the inside of the Si wafer, and the wafer is irradiated with the laser light and scanned in a grid pattern along cutting regions of chips in the wafer. Thus, the wafer surface is not damaged, but a breaking layer is formed only in the inside due to the laser light. Internal stress and cracks running in the wafer surface direction due to the internal stress are formed in the breaking layer. When external stress such as tape expansion is applied subsequently, the cracks running in the wafer surface direction can be grown so that the wafer can be divided into rectangular chips. Chipping is apt to appear in an edge surface according to existing blade dicing or the like. According to the stealth dicing technique, however, such chipping is hardly observed either in the back side or in the front side. Further, unlike surface absorption type laser machining or cutting, the stealth dicing technique has a merit that dust or the like does not scatter.

PATENT LITERATURE

PTL 1: JP-A-2010-103424
PTL 2: JP-A-2012-79836
PTL 3: JP-A-2010-79871
PTL 4: JP-A-2006-43713

The present invention is directed to overcoming or at least reducing the effects of one or more of the problems set forth above.

SUMMARY OF THE INVENTION

In the case where a Si wafer is inputted in a wafer process, it is said that the thickness of a wafer which can be processed without substantially causing any problem such as wafer cracking has a lower limit of wafer thickness at about 300 μm or more with a diameter of 6 inches or about 400 μm or more with a diameter of 8 inches. However, when a wafer thinner than the lower limit of the wafer thickness is inputted in a wafer process directly, the warp of the Si wafer increases. Accordingly, particularly at an exposure process, TTV (Total Thickness Variation) is too poor to obtain a good resolution. In addition, in high temperature processing such as impurity thermal diffusion, crystal defects easily occur due to deformation of the wafer. Moreover, even when a wafer whose wafer thickness is 300 μm with a diameter of 6 inches or a wafer thickness of 400 μm with a diameter of 8 inches satisfying the lower limit of the aforementioned range is ground, for example, to be further thinned to a finished wafer thickness of 100 μm, two thirds or three fourths of the original wafer thickness has to be removed by the grinding. In other words, when a wafer having a finished thickness or a wafer having a thickness close to the finished thickness is used from an initial stage of a wafer process, it is obvious that saving the material and simplifying the grinding step can be achieved and the cost can be also reduced. Also in the case of the reinforcing rib system wafer, the center portion of the back surface of the wafer excluding the outer circumferential portion is hollowed out. Accordingly, the ratio of the part removed by grinding is not much different from the aforementioned case.

SUMMARY OF THE INVENTION

The invention has been accomplished in consideration of the aforementioned points. The invention provides a method for separating a support substrate from a solid-phase bonded wafer and a method for manufacturing a semiconductor device, capable of using a Si wafer without substantial wafer cracking from an initial stage of a wafer process, capable of separating a support substrate from the Si wafer easily, and capable of reducing the wafer cost.

The invention further provides a method for separating a support substrate from a solid-phase bonded wafer including a Si wafer and the support substrate which is solid-phase bonded to a back surface of the Si wafer, the method including at least: a breaking layer forming step of irradiating the Si wafer with laser light which uses light with a wavelength which can pass through the Si wafer and which is focused on a solid-phase bonding interface between the Si wafer and the support substrate so as to form a breaking layer in at least a part of an outer circumferential portion of the solid-phase bonding interface; a breaking layer separating step of separating the breaking layer; and a bonding interface separating step of separating the solid-phase bonding interface.

In addition, the invention provides a method for manufacturing a semiconductor device, the method including at least: a solid-phase bonding step of solid-phase bonding a support substrate to a back surface of a Si wafer; a functional structure forming step of forming a functional structure in a front surface of the Si wafer; a breaking layer forming step of irradiating the Si wafer with laser light which uses light with a wavelength which can pass through the Si wafer and which is focused on a solid-phase bonding interface between the Si wafer and the support substrate so as to form a breaking layer in at least a part of an outer circumferential portion of the solid-phase bonding interface; a breaking layer separating step of separating the breaking layer; a bonding interface separating step of separating the solid-phase bonding interface; and a back surface processing step of performing back surface processing on the back surface of the Si wafer after the bonding interface separating step.

According to the invention, it is possible to provide a method for separating a support substrate from a solid-phase bonded wafer and a method for manufacturing a semiconductor device, capable of using a Si wafer without substantial wafer cracking from an initial stage of a wafer process, capable of separating a support substrate from the Si wafer easily, and capable of reducing the wafer cost.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1A:
FIGS. 1(a) to 1(g) show sectional views of a semiconductor substrate (wafer) showing an IGBT wafer process using a solid-phase bonding system according to the invention.
Figure 1B:

A mode as to an embodiment of the invention will be described below. However, the invention is not limited to the embodiment which will be described as follows.

A method for separating a support substrate from a solid-phase bonded wafer according to the invention includes at least a breaking layer forming step, a breaking layer separating step and a bonding interface separating step. The breaking layer forming step is a step of irradiating a Si wafer with laser light which uses light with a wavelength which can pass through the Si wafer and which is focused on a solid-phase bonding interface between the Si wafer and a support substrate so as to form a breaking layer in at least a part of an outer circumferential portion of the solid-phase bonding interface. The breaking layer is a layer which is modified by the laser light and which serves as a start point from which the support substrate will be separated.

A cutting method using a laser has been already known as a semiconductor Si wafer dicing technique (for example, PTL 4). In the cutting method, laser is focused on the inside of a Si (silicon) semiconductor wafer, and the wafer is irradiated with the laser and scanned in a grid pattern along cutting lines for division of the wafer into chips. In this manner, a cutting portion having a breaking layer is formed into a grid pattern along the cutting lines for division of the wafer into chips in the inside of the wafer. Then, the wafer is expanded together with a dicing tape and divided into chips mechanically. As in the background art, ablation occurs easily in a laser scribing system in which laser light with a wavelength high in absorption into a Si material is focused on the front surface of the Si wafer. A part of the Si scatters as molten fine particles. Particularly around an edge of the cutting portion, the Si molten fine particles are solidified to generate Si debris. Thus, the edge of the cutting portion is not a clean cutting surface. For this reason, a cutting method using a laser is preferred. In the cutting method, laser light which uses light with a wavelength which can pass through the Si wafer is focused on the inside of the Si wafer so that a breaking layer can be formed without a trace of the laser light in the Si wafer surface and only in the inside of the Si wafer in which radiation energy is focused. The single crystal structure of the Si wafer has been torn to pieces in the breaking layer. Thus, the mechanical strength in the breaking layer is weaker than that in the bulk of the single crystal Si wafer, so that the breaking layer can be separated easily. Such laser light used in the stealth dicing technique is used in the invention. The Si wafer is irradiated with the laser light which uses light with a wavelength which can pass through the Si wafer and which is focused on a solid-phase bonding interface between the Si wafer and the support substrate so as to form a breaking layer in at least a part of an outer circumferential portion of the solid-phase bonding interface. The breaking layer may be formed in the whole of the outer circumferential portion of the solid-phase bonding interface or may be formed in a part of the outer circumferential portion.

Specifically, the outer circumference (wafer side surface) of the Si support wafer (support substrate) is irradiated with the laser light which uses light with a wavelength which can pass through the Si wafer, so that the laser light is focused on the inside of the solid-phase bonding interface. A ring-like region having at least a certain length along the outer circumference is irradiated or a partial region of the outer circumference of the wafer is irradiated over a required range. A breaking layer is formed in each case. The formed breaking layer is so weak in mechanical strength that the breaking layer can be separated easily. Cracks start at the site of the separation and run toward a center portion of the Si wafer. Due to the cracks running along the solid-phase bonding interface whose bonding strength is weaker than that in the bulk, the Si wafer and the support substrate can be pulled away from each other gradually and then separated from each other.

The breaking layer separating step is a step of separating the breaking layer modified by the laser light in the breaking layer forming step. When the Si wafer and the support substrate are fixed separately and a force is applied in a direction to break the breaking layer in the solid-phase bonding interface, the breaking layer is separated. For example, the method for fixing the Si wafer and the support substrate may include a method in which the front surface of the Si wafer and the back surface of the support substrate are fixed by vacuum chucks, or electrostatic chucks respectively.

The bonding interface separating step is a step of separating the solid-phase bonding interface. When a force is applied in a direction to break the solid-phase bonding interface in the same manner as in the breaking layer separating step, cracks start at the separation site of the breaking layer and run along the solid-phase bonding interface so that the solid-phase bonding interface can be separated. The Si wafer and the support substrate are fixed separately and the bonding interface is separated in the same manner as in the breaking layer separating step. The bonding interface separating step is a step which is performed after the breaking layer separating step or simultaneously with the breaking layer separating step in accordance with the formation state of the breaking layer.

In addition to the aforementioned steps, the method for separating a support substrate from a solid-phase bonded wafer according to the invention may further include a step of cooling the front surface of the Si wafer while fixing the Si wafer by a vacuum chuck, an electrostatic chuck, etc. and heating the support substrate side by a lamp, a laser, a hot plate etc. so that the front surface and the support substrate can be separated from each other due to a thermal expansion difference therebetween.

In the method for separating a support substrate from a solid-phase bonded wafer according to the invention, voids can be provided in the solid-phase bonding interface between the Si wafer and the support substrate. Due to gaps like voids provided as unbonded portions in the solid-phase bonding interface, the solid-phase bonding interface can be separated easily in the bonding interface separating step. The voids are derived from irregularities formed in the front surface of the support substrate. When the front surface of the support substrate is partially irradiated with plasma before the support substrate is bonded to the Si wafer, concave portions are formed in the front surface of the support substrate. The concave portions serve as the voids in the solid-phase bonding interface. The voids which are not bonded to the Si wafer facilitate separation in the bonding interface separating step.

In the method for separating a support substrate from a solid-phase bonded wafer according to the invention, an oxide film can be provided in the solid-phase bonding interface between the Si wafer and the support substrate. Due to the oxide film provided as an unbonded portion in the solid-phase bonding interface, the solid-phase bonding interface can be separated easily in the bonding interface separating step. The oxide film is formed on the front surface of the support substrate. The oxide film is irradiated with plasma etc. and removed before the support substrate is bonded to the Si wafer. Due to the partial irradiation with plasma, the oxide film is left on the support substrate. The oxide film serves as an oxide film in the solid-phase bonding interface. The oxide film which is not bonded to the Si wafer facilitates separation in the bonding interface separating step. In the method for separating the support substrate according to the invention, both the voids and the oxide film may be provided in the solid-phase bonding interface.

In the method for separating a support substrate from a solid-phase bonded wafer according to the invention, preferably the laser light is applied from the side surface of the solid-phase bonded wafer. The reason is that, since a device consisting of an oxide film, a poly-Si film, a metal film, etc. is formed on the front surface of the Si wafer, the laser light cannot be transmitted or can hinder the function of the device.

In the method for separating a support substrate from a solid-phase bonded wafer according to the invention, preferably the laser light is applied in a direction perpendicular to the surface of the solid-phase bonded wafer. The laser light applied obliquely may be reflected on the front surface of the support substrate so that sufficient energy cannot be transmitted to a separation interface. In addition, there is a possibility that the inside and outside of the laser irradiation apparatus may be damaged. The reason is that, since a device consisting of an oxide film, a poly-Si film, a metal film, etc. is formed on the front surface of the Si wafer, the laser light cannot be transmitted.

In the method for separating a support substrate from a solid-phase bonded wafer according to the invention, preferably the support substrate is a substrate selected from the group consisting of a Si wafer, a Si wafer having a SiO layer in a front surface thereof and a SiC wafer. This is because these substrates are excellent in bondability with the Si wafer.

In the method for separating a support substrate from a solid-phase bonded wafer according to the invention, preferably the thickness of the Si wafer is less than 300 μm with a diameter of 6 inches, or less than 400 μm with a diameter of 8 inches. These thicknesses do not require excessive polishing based on chemical mechanical polishing etc. to thin the wafer. Accordingly, the wafer cost can be reduced sufficiently. In respect of reduction in the wafer cost, more preferably the thickness of the Si wafer is in the range of 100 μm to 150 μm with a diameter of 6 inches or in the range of 100 μm to 200 μm with a diameter of 8 inches.

Next, a method for manufacturing a semiconductor device according to the invention will be described. The method for manufacturing a semiconductor device according to the invention includes at least a solid-phase bonding step, a functional structure forming step, a breaking layer forming step, a breaking layer separating step, a bonding interface separating step, and a back surface processing step. The solid-phase bonding step is a step of solid-phase bonding a support substrate to a back surface of a Si wafer. For example, the solid-phase bonding method may include a method for bonding the Si wafer and the support substrate to each other by a hydrogen bonding method etc. Specifically, oxide film layers or absorption layers are removed from the bonded surfaces of the Si wafer and the support substrate, which are then mirror-polished. The mirror surfaces of the Si wafer and the support substrate are pasted to each other face to face in a steam atmosphere and subjected to heat treatment (at 300° C. to 700° C.) to thereby generate hydrogen bonding reaction. When the pasted substrate is further heated to a temperature, for example, 800° C. to 1,000° C., higher than a crystal plasticity temperature thereof, atoms between the Si wafer and the support substrate move to each other so that the Si wafer and the support substrate can be pasted to each other firmly to thereby form a solid-phase bonded wafer.

The functional structure forming step is a step of forming a functional structure on the front surface of the Si wafer. For example, for the purpose of manufacturing an IGBT device, a functional structure required on the front side is formed. The functional structure includes an MOS gate structure of the IGBT (a p-type base region formed selectively, an n-type emitter region formed selectively in the base region, a gate insulating film and a gate electrode provided on the base region between the emitter region and the front surface of the Si wafer, etc.), an emitter electrode, etc.

The breaking layer forming step is a step of placing a focal point on a solid-phase bonding interface between the Si wafer and the support substrate to irradiate the Si wafer with laser light using light with a wavelength which can pass through the Si wafer so as to form a breaking layer in at least a part of an outer circumferential portion of the solid-phase bonding interface. The breaking layer is a layer which is modified by the laser light and which serves as a start point from which the support substrate will be separated.

The breaking layer separating step is a step of separating the breaking layer modified by the laser light in the breaking layer forming step. When the Si wafer and the support substrate are fixed separately and a force is applied in a direction to break the breaking layer in the solid-phase bonding interface, the breaking layer is separated. For example, the method for fixing the Si wafer and the support substrate may include a method in which the front surface of the Si wafer and the back surface of the support substrate are fixed by vacuum chucks or electrostatic chucks respectively.

The bonding interface separating step is a step of separating the solid-phase bonding interface. When a force is applied in a direction to break the solid-phase bonding interface in the same manner as in the breaking layer separating step, cracks start at the separation site of the breaking layer and run along the solid-phase bonding interface so that the solid-phase bonding interface can be separated. The Si wafer and the support substrate are fixed separately and the bonding interface is separated in the same manner as in the breaking layer separating step. The bonding interface separating step is a step which is performed after the breaking layer separating step or simultaneously with the breaking layer separating step in accordance with the formation state of the breaking layer.

The back surface processing step is a step of applying back surface processing to the back surface of the Si wafer after the bonding interface separating step. The back surface processing includes formation of an $n^+$ buffer layer, a $p^+$ collector layer, a collector electrode, etc.

The method for manufacturing a semiconductor device according to the invention may further include a dicing step of dividing the Si wafer into individual chips and a plating step of forming an Au/Ni film on an Al electrode in the front surface of the Si wafer, in addition to the aforementioned steps.

According to the method for manufacturing a semiconductor device according to the invention, voids can be provided in the solid-phase bonding interface between the Si wafer and the support substrate. Due to gaps such as the voids provided as unbonded portions in the solid-phase bonding interface, the solid-phase bonding interface can be separated easily in the bonding interface separating step.

According to the method for manufacturing a semiconductor device according to the invention, an oxide film can be provided in the solid-phase bonding interface between the Si wafer and the support substrate. Due to the oxide film provided as an unbonded portion in the solid-phase bonding interface, the solid-phase bonding interface can be separated easily in the bonding interface separating step. According to the method for manufacturing a semiconductor device according to the invention, both the voids and the oxide film may be provided in the solid-phase bonding interface.

In the method for manufacturing a semiconductor device according to the invention, preferably the laser light is applied from the side surface of the solid-phase bonded wafer. The reason is that, since a device consisting of an oxide film, a poly-Si film, a metal film, etc. is formed on the front surface of the Si wafer, the laser light cannot be transmitted or can hinder the function of the device.

In the method for manufacturing a semiconductor device according to the invention, preferably the laser light is applied in a direction perpendicular to the surface of the solid-phase bonded wafer. The laser light applied obliquely may be reflected on the front surface of the support substrate so that sufficient energy cannot be transmitted to a separation interface. In addition, there is a possibility that the inside and outside of the laser irradiation apparatus may be damaged. The reason is that, since a device consisting of an oxide film, a poly-Si film, a metal film, etc. is formed on the front surface of the Si wafer, the laser light cannot be transmitted.

In the method for manufacturing a semiconductor device according to the invention, preferably the support substrate is a substrate selected from the group consisting of a Si wafer, a Si wafer having a SiO layer in a front surface thereof and a SiC wafer. It is because these substrates are excellent in bondability with the Si wafer.

In the method for manufacturing a semiconductor device according to the invention, preferably the thickness of the Si wafer is less than 300 µM with a diameter of 6 inches, or less than 400 µm with a diameter of 8 inches. These thicknesses do not require excessive polishing based on chemical mechanical polishing etc. to make the wafer thin. Accordingly, the wafer cost can be reduced sufficiently. In respect of reduction in the wafer cost, more preferably the thickness of the Si wafer is in the range of 100 µm to 150 µm with a diameter of 6 inches or in the range of 100 µm to 200 µm with a diameter of 8 inches.

Examples of the method for separating a support substrate from a solid-phase bonded wafer according to the invention and the method for manufacturing a semiconductor device using this method will be described below in detail with reference to the drawings. The invention is not limited to the following description of Examples as long as it does not depart from the scope and spirit of the invention.

EXAMPLES

Figure 1C:
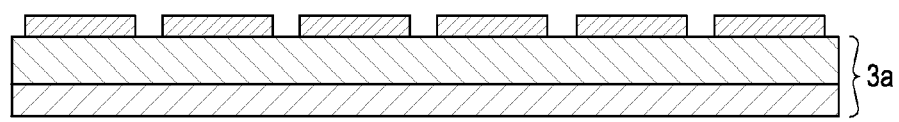
Figure 4A:
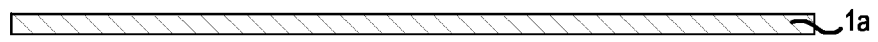
FIGS. 4(a) to 4(g) show sectional views of a semiconductor substrate (wafer) showing an IGBT wafer process using another solid-phase bonding system according to the invention.
Figure 4A:
Figure 4B:
Figure 4C:
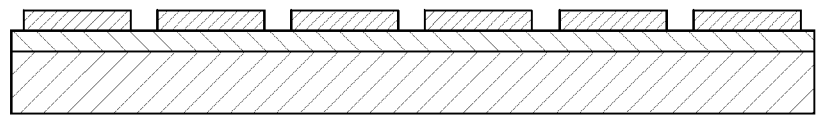
Figure 4D:
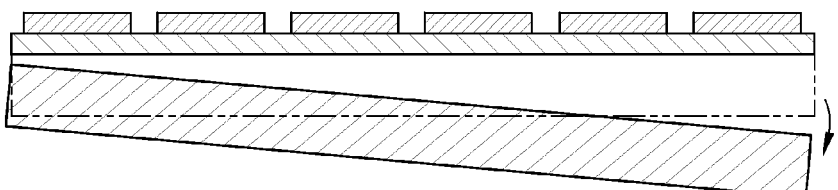
Figure 4E:
Figure 4F:
Figure 4G:

Example 1 of the method for manufacturing a semiconductor device using the method for separating a support substrate from a solid-phase bonded wafer according to the invention will be described in detail with reference FIG. 1. FIG. 1 includes sectional views, all of which show wafers. CZ-p type Si support wafer 2a having a diameter of 8 inches and a thickness of 300 µm is prepared as a support substrate for FZ-n type Si wafer 1a having the same diameter and a thickness less than 400 µm (FIG. 1(a)). Here, Si wafer 1b with a thickness of 100 µm and support wafer 2b with a thickness of 700 µm may be prepared alternatively, as shown in FIG. 4(a). In FIG. 4, Si solid-phase bonded wafer 3b is used. In Si solid-phase bonded wafer 3b, Si wafer 1b having a thickness of 100 µm substantially corresponding to the thickness of a finished wafer and support wafer 2b having a thickness of 700 µm are bonded to each other by solid-phase bonding. Accordingly, the method in FIG. 4 is the same as the method in FIG. 1 except that a back surface grinding step in FIG. 1(e) is dispensable.

As shown in FIG. 1, the two wafers, i.e., Si wafer 1a and Si support wafer 2a, are directly pasted to each other not by an organic adhesive agent, but by a well-known method such as a hydrogen bonding method. Specifically, mirror finishing is applied to two main surfaces as the pasted surfaces of Si wafer 1a and Si support wafer 2a. When the mirror surfaces of the two wafers, i.e., Si wafer 1a and Si support wafer 2a are pasted to each other face to face in a clean steam atmosphere and subject to heat treatment (at 300° C. to 700° C.), hydrogen bonding reaction occurs in the surfaces of Si wafer 1a and Si support wafer 2a through $H_2O$ molecules. When Si wafer 1a and Si support wafer 2a pasted to each other are heated to 800° C. to 1,000° C. higher than the crystal plasticity temperature, atoms between the two wafers, i.e., Si wafer 1a and Si support wafer 2a, move toward each other so as to form a Si solid-phase bonded wafer 3a in which Si wafer 1a and Si support wafer 2a are pasted to each other firmly (FIG. 1(b)). As for Si solid-phase bonded wafer 3a, Si wafer 1a side is regarded as the front surface and Si support wafer 2a side is regarded as the back surface.

Even in the case where wafers made of different materials are pasted to each other, the two wafers which have been brought into close contact with each other are heated to a temperature equal to or higher than the crystal plasticity temperature using the well-known hydrogen bonding reaction etc. and then cooled. In this manner, the two wafers can be formed into a solid-phase bonded wafer. Distortion, warp, etc. caused by a difference in thermal expansion coefficient between the original wafers occurs easily in the solid-phase bonded wafer. That is, when semiconductor wafers or metal substrates, etc., largely different in thermal expansion coefficient from Si (silicon) are pasted to each other, distortion or warp caused by the difference in thermal expansion coefficient at the time of wafer bonding, particularly at the time of the wafer cooling step, may occur so that warp or damage may occur easily in the pasted wafers. It is therefore preferable that a material substrates having a difference in thermal expansion coefficient from Si which as small as possible are pasted to each other substrate.

For example, for the purpose of manufacturing an IGBT device, a functional structure required on the front side is formed on the front side of Si solid-phase bonded wafer 3a. The functional structure includes an MOS gate structure of the IGBT (a p-type base region formed selectively, an n-type emitter region formed selectively in the base region, a gate insulating film and a gate electrode provided on the base region between the emitter region and the front surface of Si wafer 1a), and an emitter electrode, etc. This formation of the front side functional structure such as the MOS gate structure includes a photolithography step which requires high flatness in a wafer, and impurity thermal diffusion steps which require high temperature processing at 1,000° C. or higher. When the flatness of Si solid-phase bonded wafer 3a is high, the MOS gate structure can be formed on the front side without any problem (FIG. 1(c)). When a Si support wafer is used as the support substrate, the heatproof temperature of Si solid-phase bonded wafer 3a is also unchanged from that of the Si semiconductor substrate. The reference numeral 4 in FIG. 1(c) represents a section of the aforementioned front side functional structure including the MOS gate structure of the IGBT, the emitter electrode, etc.

Figure 1D:
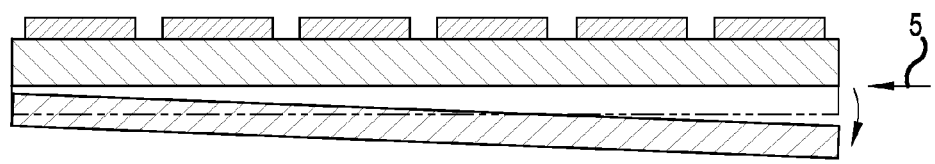
Figure 1E:
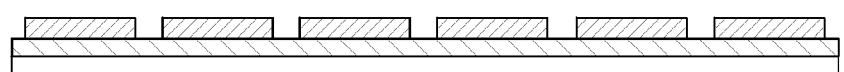
Figure 1F:
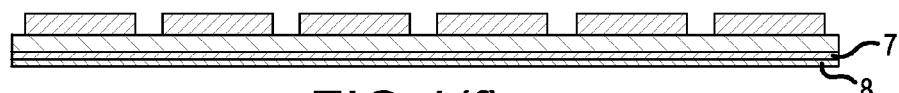
Figure 1G:
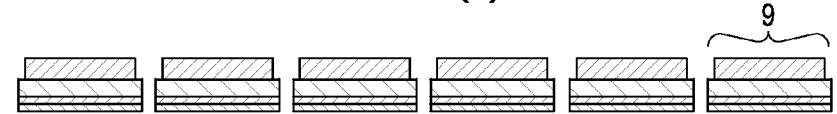
Figure 2A:
FIGS. 2(a) to 2(e) show sectional views of a semiconductor substrate (wafer) whose back surface is grounded by a reinforcing rib system in an IGBT wafer process according to the background art.
Figure 2B:
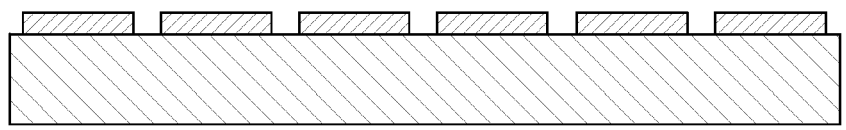
Figure 2C:
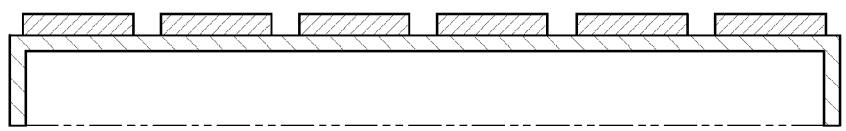
Figure 2D:
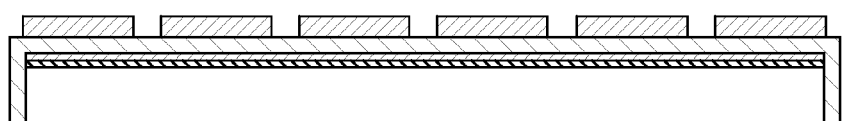
Figure 2E:
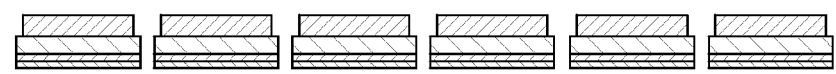
Figure 3A:
FIGS. 3(a) to 3(e) show sectional views of a semiconductor substrate (wafer) showing an IGBT wafer process according to the background art.
Figure 3B:
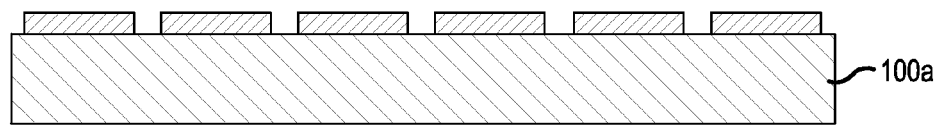
Figure 3C:
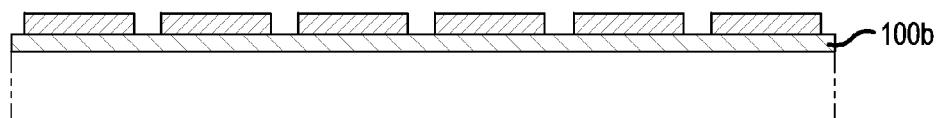
Figure 3D:
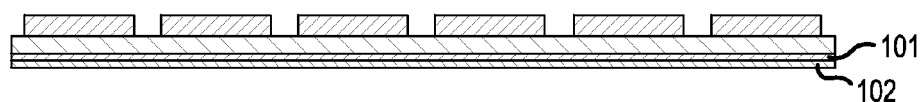
Figure 3E:
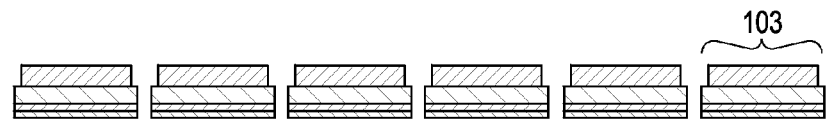
Figure 5A:
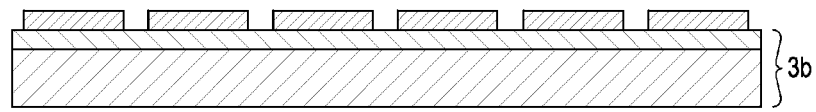
FIGS. 5(a) to 5(d) show sectional views and plan views of a Si wafer for explaining the solid-phase bonding system according to the invention.
Figure 5B:
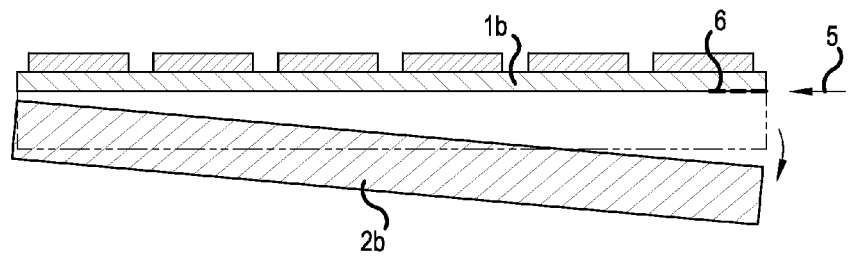
Figure 5C:
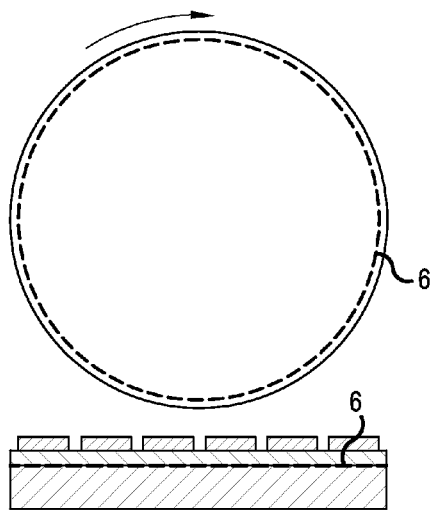

Laser light 5 is applied in parallel with the wafer surface from outside of a side surface of Si solid-phase bonded wafer 3a where the front side functional structure has been formed, so as to be focused on the solid-phase bonding interface inside an outer circumferential portion of Si solid-phase bonded wafer 3a to thereby form a breaking layer (FIG. 1(d)). This irradiation with laser light 5 is a preparatory step which prepares to separate the Si support wafer from Si solid-phase bonded wafer 3a. A separation step including the preparatory step will be described further with reference to FIG. 5. As shown in FIG. 5, Si solid-phase bonded wafer 3b on which the front side processing has been finished is irradiated with laser light 5 focused on the interface from the outer circumferential end of Si solid-phase bonded wafer 3b so that breaking layer 6 is provided along the solid-phase bonding interface. The circumferential length of breaking layer 6 may be as long as the whole circumference (FIG. 5(c)). It is not necessary to provide breaking layer 6 over the entire circumference, but it is preferable that breaking layer 6 is formed with a length corresponding to about half the circumference. It is preferable that the wafer is rotated as indicated by the arrow during the laser irradiation to form breaking layer 6 all over the circumference, as shown in FIG. 5(c). In addition, a part of the outer circumferential end of Si solid-phase bonded wafer 3b may be scanned and irradiated, not circumferentially, but rather from the outer circumferential end toward the center, for example, to the inner side about 10 mm deep, so as to increase the depth of the focal point to thereby form breaking layer 6. In this case, the circumferential length of breaking layer 6 may be shortened to about 20 mm (FIG. 5(d)). Although the solid-phase bonding interface of the outer circumferential portion of the Si-solid bonded wafer 3a is irradiated with the laser light from one side of the wafer and in parallel to the wafer surface in the aforementioned description, irradiation may be made in a direction perpendicular to the wafer surface so as to hit the focal point on the outer circumferential portion of the solid-phase bonding interface.

The laser irradiation method will be described below. When a photon energy hv is lower than a band gap $E_G$ of absorption of a material, the material is transparent optically. Therefore, the condition of causing absorption in the material is $hv > E_G$. However, in the case of laser light with very high intensity, absorption occurs in the material under the condition of $nhv > E_G$ (n=2, 3, 4 . . . ) in spite of its optical transparency. This phenomenon is called multi-photon absorption. The intensity of pulse-wave laser light is determined depending on peak power density (W/cm$^2$) at a focal point of the laser light. For example, multi-photon absorption occurs under the condition that the peak power density is not lower than $1 \times 10^8$ (W/cm$^2$). The peak power density can be obtained by (energy per pulse of laser light at focal point)/(sectional area of beam spot of laser light×pulse width). On the other hand, the intensity of continuous-wave laser light is determined depending on the electric field intensity (W/cm$^2$) at the focal point of the laser light.

In the breaking layer forming step according to the invention, the solid-phase bonding interface is irradiated with laser light focused thereon under the condition of causing multi-photon absorption, so as to form a breaking layer. In the invention, the Si wafer does not absorb the laser light to generate heat to thereby form a breaking layer, but the laser light is transmitted through the Si wafer to cause multi-photon absorption in the solid-phase bonding interface to thereby form a breaking layer. The laser light is not absorbed in the Si wafer. Therefore, the surface of the Si wafer is not melted.

In the breaking layer forming step according to the invention, the laser light and the condition of irradiation with the laser light may be set as follows.

(A) laser light
  light source: semiconductor laser excited Nd:YAG laser
  wavelength: 1,064 nm
  sectional area of laser light spot: $3.14 \times 10^{-8}$ cm$^2$
  oscillation mode: Q switch pulse
  repetition frequency: 100 kHz
  pulse width: 30 ns
  output: output <1 mJ/pulse
  laser light quality: TEM$_{00}$
  polarization characteristic: linear polarization
(B) condensing lens
  transmittance to laser light wavelength: 60%
(C) moving speed of a mounting stage for mounting Si solid-phase bonded wafer: 100 mm/sec The laser light quality TEM$_{00}$ means that the condensing property is high enough to condense laser light of a wavelength about as high as the wavelength of laser light.

Si support wafer 2a as a support substrate is separated from Si wafer 1a in the following manner. That is, as shown in FIG. 1(d), a part of the outer circumference of Si support wafer 2 is lifted up to first separate breaking layer 6 provided in the wafer outer circumferential portion, so as to make an opportunity for separation. Next, the wafer is lifted up gradually till the wafer as a whole is lifted up for entire separation. Alternatively, the wafer may be lifted up in a plurality of stages.

When the lifting-up angle is limited, even the lifted up Si wafer 1a which has been thinned can be warped without any cracks. As a result, Si support wafer 2a as a support substrate can be separated from Si solid-phase bonded wafer 3a to which Si support wafer 2a has been pasted.

After Si support wafer 2a is separated, it may be necessary to remove the breaking layer etc. from the separation surface of the Si wafer or to further thin Si wafer 1a. In such a case, grinding, CMP (chemical mechanical polishing) polishing or etching with chemicals is applied to the separation surface to make the wafer 100 μm thick (FIG. 1(e)), in the same manner as in the background-art process. Required back surface processing is applied to the polished wafer surface (back surface). The back surface processing includes formation of an n$^+$ buffer layer (not shown), p$^+$ collector layer 7, collector electrode 8, etc. (FIG. 1(f)). A dicing step (FIG. 1(g)) is performed to manufacture IGBT chips 9.

Figure 6A:
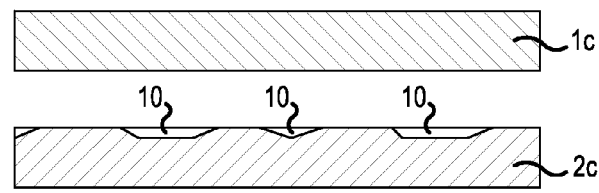
FIGS. 6(a) to 6(c) show sectional views and an ultrasonographic picture of a solid-phase bonded wafer in which voids are provided in a solid-phase bonding interface between a Si wafer and a support substrate.
Figure 6B:
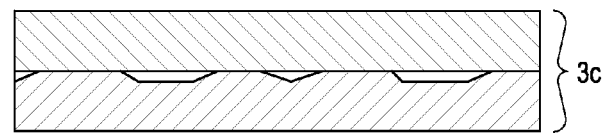
Figure 6C:
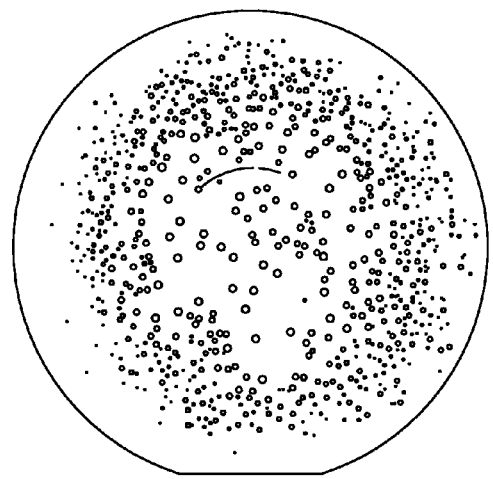

FIG. 6 includes sectional views and an ultrasonographic picture of a solid-phase bonded wafer in which voids are provided in a solid-phase bonding interface between a Si wafer and a support substrate. CZ-p type Si support wafer 2c having a diameter of 8 inches and a thickness of 300 μm is prepared as a support substrate for FZ-n type Si wafer 1c having the same diameter and a thickness less than 400 μm (FIG. 6(a)). Here, Si support wafer 2c has voids 10 in parts of the pasted surface to Si wafer 1c. Voids 10 can be formed by entire or partial irradiation with plasma in the front surface of support wafer 2c before support wafer 2c is bonded to the Si wafer. When Si solid-phase bonded wafer 3c is formed by pasting Si wafer 1c and Si support wafer 2c to each other, the voids are provided in the solid-phase bonding interface (FIG. 6(b)). Due to gaps such as the voids serving as unbonded portions in the solid-phase bonding interface, the solid-phase bonding interface can be separated easily in the bonding interface separating step. FIG. 6(c) shows an ultrasonographic picture of a Si solid-phase bonded wafer. From the picture taken from the front surface direction of the Si wafer in the Si solid-phase bonded wafer, voids distributed like white spots in a bonding interface can be confirmed.

Figure 7A:
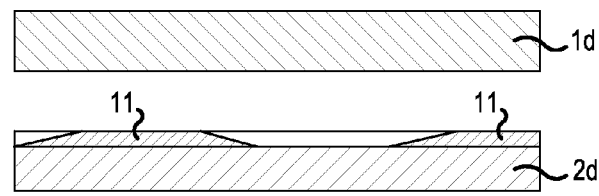
FIGS. 7(a) and 7(b) show sectional views of a solid-phase bonded wafer in which an oxide film is provided in a solid-phase bonding interface between a Si wafer and a support substrate.
Figure 7B:
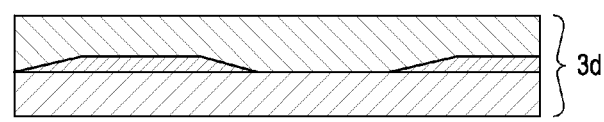

FIG. 7 includes sectional views of a solid-phase bonded wafer where an oxide film is provided in a solid-phase bonding interface between a Si wafer and a support substrate. CZ-p type Si support wafer 2d having a diameter of 8 inches and a thickness of 300 μm is prepared as a support substrate for FZ-n type Si wafer 1d having the same diameter and a thickness less than 400 μm (FIG. 7(a)). Here, Si support wafer 2d has oxide film 11 in parts of the pasted surface to Si wafer 1d. Si support wafer 2d partially having the oxide film can be formed in such a manner that the surface of the support wafer having the oxide film in the whole surface is partially irradiated with plasma to partially remove the oxide film before the support wafer is bonded to the Si wafer. When a Si solid-phase bonded wafer 3d is formed by pasting Si wafer 1d and Si support wafer 2d to each other, the oxide film is provided in the solid-phase bonding interface (FIG. 7(b)). Due to the oxide film serving as an unbonded portion in the solid-phase bonding interface, the solid-phase bonding interface can be separated easily in the bonding interface separating step.

FIG. 8 includes sectional views showing an embodiment of the breaking layer separating step and the bonding interface separating step according to the invention. Description will be made about Si solid-phase bonded wafer 3c in which Si wafer 1c and Si support wafer 2c with voids 10 are pasted to each other and front side functional structure 4 is further formed, by way of example (FIG. 8(a)). The solid-phase bonding interface is irradiated with laser light 5 from a side surface of Si solid-phase bonded wafer 3c so as to form a breaking layer 6 all over the circumference of the solid-phase bonding interface (FIG. 8(b)). Next, the front surface of Si wafer 1c on which front side functional structure 4 has been formed is fixed by suction device 12 and suction device 13. The back surface of Si support wafer 2c is fixed on wafer fixation stage 14 by a vacuum chuck or an electrostatic chuck (FIG. 8(b)).

Suction device 12 is configured so that suction device 12 can move simultaneously to make the suction surface of suction device 12 flush with the suction surface of suction device 13, and further only suction device 12 can move independently of suction device 13.

Figure 8A:
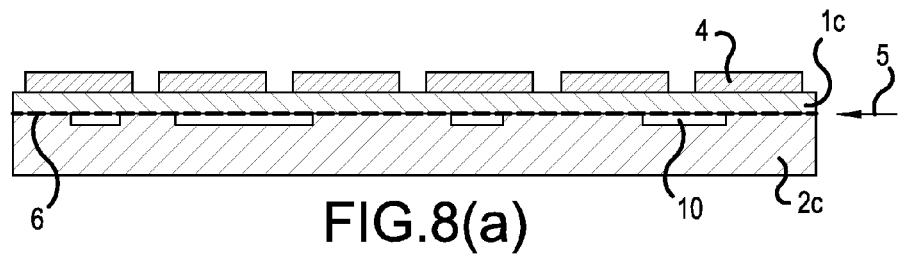
FIGS. 8(a) to 8(d) show sectional views showing an embodiment of a breaking layer separating step and a bonding interface separating step according to the invention.
Figure 8B:
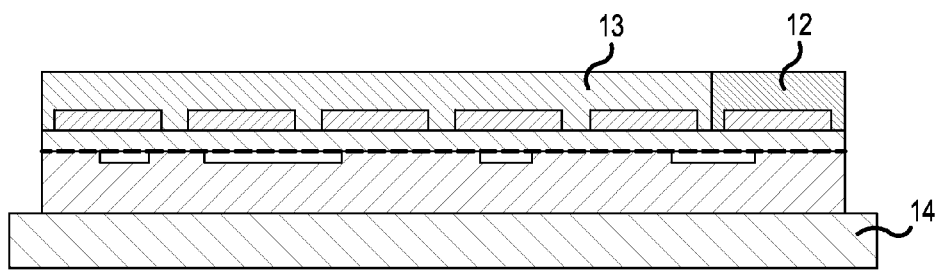
Figure 8C:
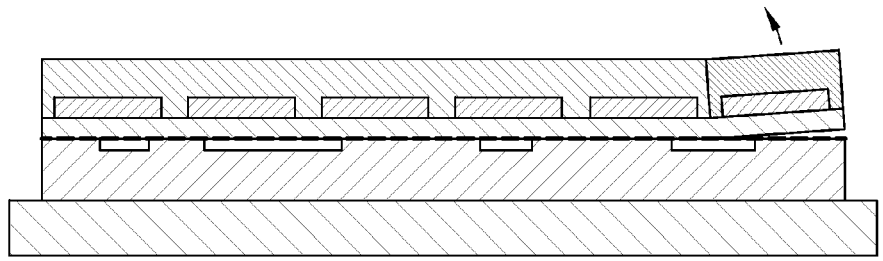
Figure 8D:
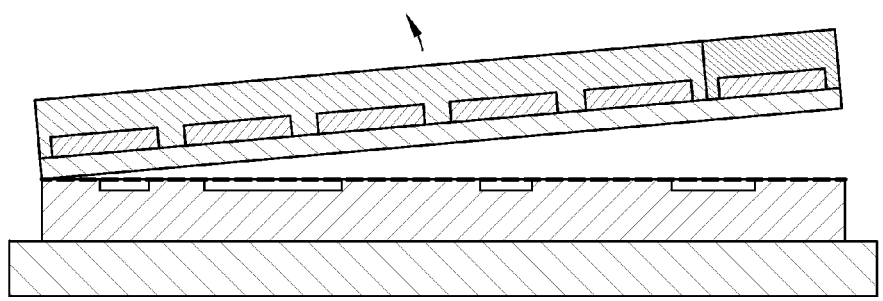
Figure 9A:
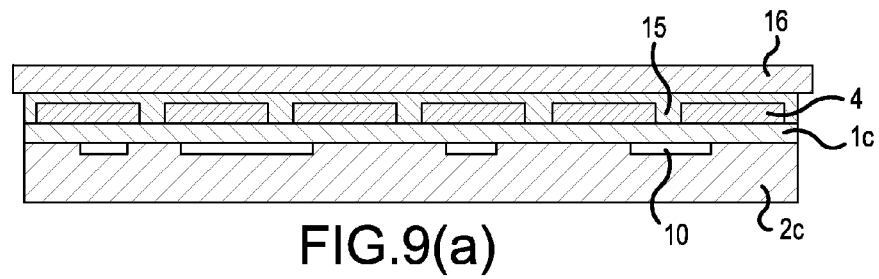
FIGS. 9(a) to 9(e) shows sectional views showing another embodiment of the breaking layer separating step and the bonding interface separating step according to the invention than that in FIG. 8.
Figure 9B:
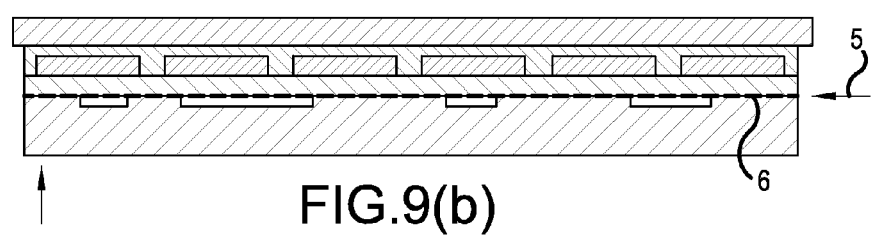
Figure 9C:
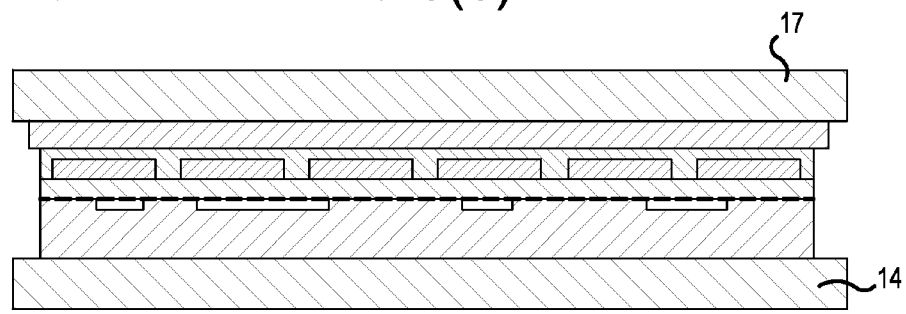
Figure 9D:
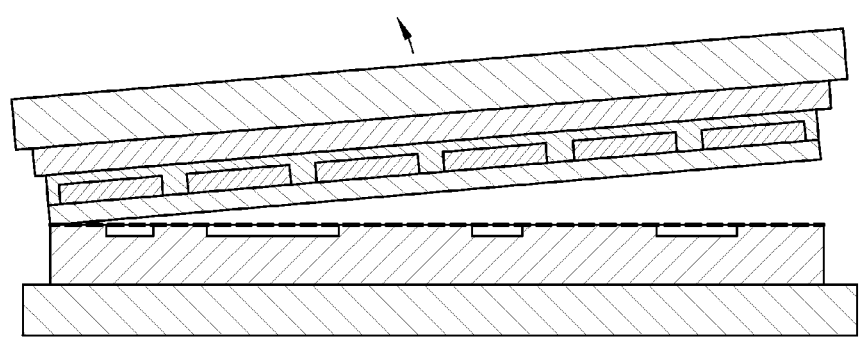
Figure 9E:
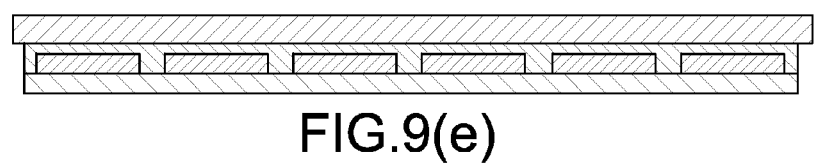

While suction device 13 remains stationary, suction device 12 is lifted up in a direction to lift up an end portion of Si wafer 1c (in a direction of an arrow in FIG. 8(c)). Breaking layer 6 in an end portion of the solid-phase bonding interface between Si wafer 1c and Si support wafer 2c (in an end portion of the outer circumference of each wafer) is separated to make an opportunity (separation portion) to separate the solid-phase bonding interface as a whole (FIG. 8(c)).

The direction to lift up the end portion is a direction slightly inclined to the inside of the Si wafer with respect to a direction perpendicular to the suction surfaces of suction devices 12 and 13. When the inclination to the inside is large, the opportunity to separate the end portion of the solid-phase bonding interface can be made easily, but great stress may be applied to the vicinity of the boundary between suction device 12 and suction device 13. Accordingly, it is advantageous if the outer circumference of Si wafer 1c is lifted up with an inclination slight enough not to crack Si wafer 1c (for example, about 5°).

After that, the suction surface of suction device 12 is resumed to be flush with the suction surface of suction device 13. Successively, the suction surfaces of suction devices 12 and 13 kept flush with each other are lifted up in a direction to separate the solid-phase bonding interface continuously from the separation portion which has been formed by suction device 12 (in a direction of an arrow in FIG. 8(d)). The suction surfaces of suction devices 12 and 13 are tilted gradually to separate the solid-phase bonding interface as a whole (FIG. 8(d)). Suction device 12 and suction device 13 are pulled up stepwise to generate cracks starting at the separation site of breaking layer 6 and extending along the solid-phase bonding interface. Thus, separation can be made in the solid-phase bonding interface. In this example, due to voids 10 provided in the solid-phase bonding interface, solid-phase bonding is not achieved in the portions of voids 10. It is therefore easy to make the separation.

Figure 5D:
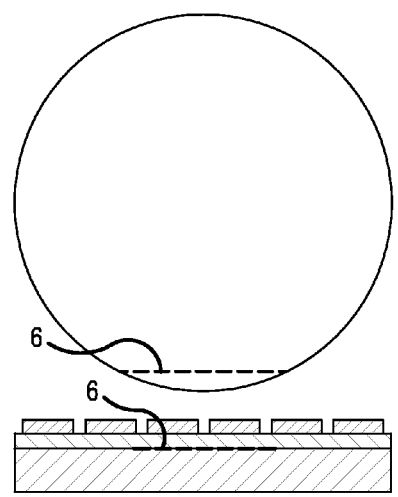

In the case where only a part of the wafer is irradiated with laser light as shown in FIG. 5(d), the site irradiated with the laser light had better be sucked by suction device 12.

As shown in FIG. 8, the separation apparatus including suction devices 12 and 13 may be used not only for the case where voids 10 are provided in the solid-phase bonding interface. For example, the separation apparatus may be applied to a semiconductor substrate which is solid-phase bonded without voids 10 and irradiated with laser light as shown in FIGS. 5(c) and (d).

FIG. 9 includes sectional views showing another embodiment of the breaking layer separating step and the bonding interface separating step according to the invention than that in FIG. 8. Description will be made about Si solid-phase bonded wafer 3c in which Si wafer 1c and Si support wafer 2c with voids 10 are pasted to each other and front side functional structure 4 is further processed, by way of example (FIG. 9(a)). Support material 16 is pasted to the front surface of Si wafer 1c on which front side functional structure 4 has been processed by adhesive agent 15 (FIG. 9(a)). Si, SiC, glass, etc. are used as raw materials for support material 16. Si solid-phase bonded wafer 3c is irradiated with laser light 5 from a side surface or a back surface of Si solid-phase bonded wafer 3c so as to form breaking layer 6 all over the circumference of the solid-phase bonding interface (FIG. 9(b)). Next, the back surface of support material 16 and the back surface of Si support wafer 2c are fixed on wafer fixation stages 17 and 14 respectively by vacuum chucks or electrostatic chucks (FIG. 9(c)). Then, wafer fixation stage 17 is pulled in a direction slightly inclined to the inside of the Si wafer with respect to a direction perpendicular to the suction surface thereof (in a direction of an arrow in FIG. 9(d)), so as to be lifted up from an end portion to thereby separate the end portion of the solid-phase bonding interface from breaking layer 6 at that end portion. Thus, an opportunity to separate the solid-phase bonding interface as a whole is made (FIG. 9(d)). After that, wafer fixation stage 17 is further pulled in the direction of the arrow to be lifted up so as to separate the solid-phase bonding interface as a whole (FIG. 9(d)). In the state where wafer fixation stage 17 is removed and support material 16 is still fixed (FIG. 9(e)), the separation surface is smoothened by CMP polishing if necessary. Then, back surface processing is applied to form an $n^+$ buffer layer, a $p^+$ collector layer, a collector electrode, etc. Support material 16 is removed, and a dicing step is performed for division of the wafer into chips.

The configuration shown in FIG. 9 may be used in cases other than the case where voids 10 are provided in the solid-phase bonding interface. For example, the configuration may be also applied to a semiconductor substrate which is solid-phase bonded without voids 10 and irradiated with laser light as shown in FIGS. 5(c) and (d).

Although a Si semiconductor substrate is used as a support substrate in the Examples described above, another support substrate may be used. For example, the support substrate may be a substrate selected from a Si semiconductor substrate having a SiO layer on its front surface and a SiC semiconductor substrate.

According to the Examples described above, it is possible to provide a method for separating a support substrate from a solid-phase bonded wafer and a method for manufacturing a semiconductor device, capable of using a Si wafer without substantial wafer cracking at an initial stage where the wafer is inputted to a wafer process, capable of separating a support substrate from the wafer easily, and capable of reducing the wafer cost.

Thus, a semiconductor device and method for its manufacture have been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

What is claimed is:

1. A method for separating a support substrate from a solid-phase bonded wafer which includes a Si wafer and the support substrate solid-phase bonded to a back surface of the Si wafer, the method comprising at least:
   a breaking layer forming step of irradiating the Si wafer with laser light which uses light with a wavelength which can pass through the Si wafer and which is focused on a solid-phase bonding interface between the Si wafer and the support substrate so as to form a breaking layer in at least a part of an outer circumferential portion of the solid-phase bonding interface;
   a breaking layer separating step of separating the breaking layer; and a bonding interface separating step of separating the solid-phase bonding interface.

2. A method for separating a support substrate from the solid-phase bonded wafer according to claim 1, wherein voids are provided in the solid-phase bonding interface between the Si wafer and the support substrate.

3. A method for separating a support substrate from the solid-phase bonded wafer according to claim 1, wherein an oxide film is provided in the solid-phase bonding interface between the Si wafer and the support substrate.

4. A method for separating a support substrate from the solid-phase bonded wafer according to claim 1, wherein the laser light is applied from a side surface of the solid-phase bonded wafer.

5. A method for separating a support substrate from the solid-phase bonded wafer according to claim 1, wherein the laser light is applied in a direction perpendicular to a surface of the solid-phase bonded wafer.

6. A method for separating a support substrate from the solid-phase bonded wafer according to claim 1, wherein the support substrate is a substrate selected from the group consisting of a Si wafer, a Si wafer having a SiO layer in a front surface thereof, and a SiC wafer.

7. A method for separating a support substrate from the solid-phase bonded wafer according to claim 1, wherein the thickness of the Si wafer is less than 300 μm with a diameter of 6 inches, or less than 400 μm with a diameter of 8 inches.

8. A method for manufacturing a semiconductor device, comprising at least:
a solid-phase bonding step of solid-phase bonding a support substrate to a back surface of a Si wafer;
a functional structure forming step of forming a functional structure in a front surface of the Si wafer;
a breaking layer forming step of irradiating the Si wafer with laser light which uses light with a wavelength which can pass through the Si wafer and which is focused on a solid-phase bonding interface between the Si wafer and the support substrate so as to form a breaking layer in at least a part of an outer circumferential portion of the solid-phase bonding interface;
a breaking layer separating step of separating the breaking layer;
a bonding interface separating step of separating the solid-phase bonding interface; and
a back surface processing step of performing back surface processing on the back surface of the Si wafer after the bonding interface separating step.

9. The method for manufacturing a semiconductor device according to claim 8, wherein voids are provided in the solid-phase bonding interface between the Si wafer and the support substrate.

10. The method for manufacturing a semiconductor device according to claim 8, wherein an oxide film is provided in the solid-phase bonding interface between the Si wafer and the support substrate.

11. The method for manufacturing a semiconductor device according to claim 8, wherein the laser light is applied from a side surface of the solid-phase bonded wafer.

12. The method for manufacturing a semiconductor device according to claim 8, wherein the laser light is applied in a direction perpendicular to a surface of the solid-phase bonded wafer.

13. The method for manufacturing a semiconductor device according to claim 8, wherein the support substrate is a substrate selected from the group consisting of a Si wafer, a Si wafer having a SiO layer in a front surface thereof, and a SiC wafer.

14. The method for manufacturing a semiconductor device according to claim 8, wherein the thickness of the Si wafer is less than 300 μm with a diameter of 6 inches, or less than 400 μm with a diameter of 8 inches.

* * * * *